(12) United States Patent
Hsu

(10) Patent No.: US 9,118,150 B2
(45) Date of Patent: Aug. 25, 2015

(54) ELECTRICAL CONNECTOR AND ELECTRICAL CONNECTOR ASSEMBLY USED THEREOF

(71) Applicant: HON HAI PRECISION INDUSTRY CO., LTD., New Taipei (TW)

(72) Inventor: Shuo-Hsiu Hsu, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 89 days.

(21) Appl. No.: 14/052,607

(22) Filed: Oct. 11, 2013

(65) Prior Publication Data

US 2014/0315400 A1    Oct. 23, 2014

(30) Foreign Application Priority Data

Apr. 18, 2013    (TW) .............................. 102113714 A

(51) Int. Cl.
| | | |
|---|---|---|
| *H01R 12/00* | (2006.01) | |
| *H01R 12/70* | (2011.01) | |
| *H01R 43/02* | (2006.01) | |
| *H05K 3/34* | (2006.01) | |

(52) U.S. Cl.
CPC .......... *H01R 12/707* (2013.01); *H01R 43/0256* (2013.01); *H01R 43/0263* (2013.01); *H05K 3/341* (2013.01); *H05K 2201/10325* (2013.01)

(58) Field of Classification Search
CPC ..................................................... H01R 12/57
USPC ..................................................... 439/83, 876
See application file for complete search history.

(56) References Cited

U.S. PATENT DOCUMENTS

| | | | |
|---|---|---|---|
| 7,086,902 B1 * | 8/2006 | Yang ........................ | 439/607.36 |
| 7,278,860 B2 * | 10/2007 | Ma .................................. | 439/73 |
| 7,963,800 B1 * | 6/2011 | Chen et al. ............... | 439/607.27 |
| 8,905,765 B2 * | 12/2014 | Yeh .................................. | 439/73 |
| 2001/0034145 A1 * | 10/2001 | Uratani et al. .................. | 439/83 |

FOREIGN PATENT DOCUMENTS

TW    285832    1/2006

* cited by examiner

*Primary Examiner* — Phuong Dinh
(74) *Attorney, Agent, or Firm* — Wei Te Chung; Ming Chieh Chang

(57) ABSTRACT

An electrical connector assembly includes an electrical connector (100) and a pick up cap (3) assembled thereon. The electrical connector (100) includes an insulative housing (1) with a plurality of contacts (11) received therein, a plurality of soldering members (12) connected the contacts (11) and protruded beyond the bottom of the insulative housing (1), and a position member (2) surrounded and moved upwardly and downwardly relative to the insulative housing (1). The insulative housing (1) includes a limit portion (102) protruded outwardly, the pick up cap (3) includes a stop portion (31) protruded toward the limited portion (102) and the position member (2) includes a body portion (20) positioned therebetween. When the soldering members (12) and the position member (2) are put on a same plane, there is a space between the body portion (20) and the stop portion (31).

11 Claims, 5 Drawing Sheets

US 9,118,150 B2

ELECTRICAL CONNECTOR AND ELECTRICAL CONNECTOR ASSEMBLY USED THEREOF

BACKGROUND OF THE INVENTION

1. Field of the Invention

The present invention relates to an electrical connector and electrical connector assembly used thereof, and more particularly to an electrical connector and electrical connector assembly used thereof having an insulative housing moving downwardly when soldered to a substrate.

2. Description of Related Art

TW patent No. M285832 issued to Zhu on Jan. 11, 2006 discloses a conventional electrical connector for electrically connecting an IC package with a substrate. The electrical connector includes an insulative housing, a plurality of electrical contacts received in the insulative housing and a plurality of solder balls connected to the electrical contacts. The bottom of the insulative housing defines a post to position the insulative housing on the substrate and the solder balls connect with the substrate. When the electrical connector is assembled to the substrate, due to the insulative housing is positioned on the substrate by the post, it can not move downwardly when the solder balls are melted. Thus, some of the solder balls after melted may be disconnected with the substrate.

Hence, it is desirable to provide an improved electrical connector to overcome the aforementioned disadvantages.

SUMMARY OF THE INVENTION

Accordingly, an object of the present invention is to provide an electrical connector and electrical connector assembly used thereof having an insulative housing moving downwardly when soldered to a substrate.

According to one aspect of the present invention, an electrical connector assembly for soldering to a substrate and comprises an electrical connector soldered to the substrate and a pick up cap assembled to the electrical connector. The electrical connector comprises an insulative housing with a plurality of contacts received therein, a plurality of soldering members connected the contacts and a position member surrounded the insulative housing and moved upwardly and downwardly relative to the insulative housing. The insulative housing comprises a limit portion protruded outwardly. The pick up cap comprises a stop portion protruded toward the limited portion. The position member comprises a body portion positioned between the stop portion and the limit portion. The soldering members protruded beyond the bottom of the insulative housing. When the soldering members and the position member are put on a same plane, there is a space between the body portion of the position member and the stop portion of the pick up cap.

Other objects, advantages and novel features of the invention will become more apparent from the following detailed description when taken in conjunction with the accompanying drawings, in which:

DETAILED DESCRIPTION OF THE INVENTION

Reference will now be made to the drawings to describe the present invention in detail.

Figure 1:
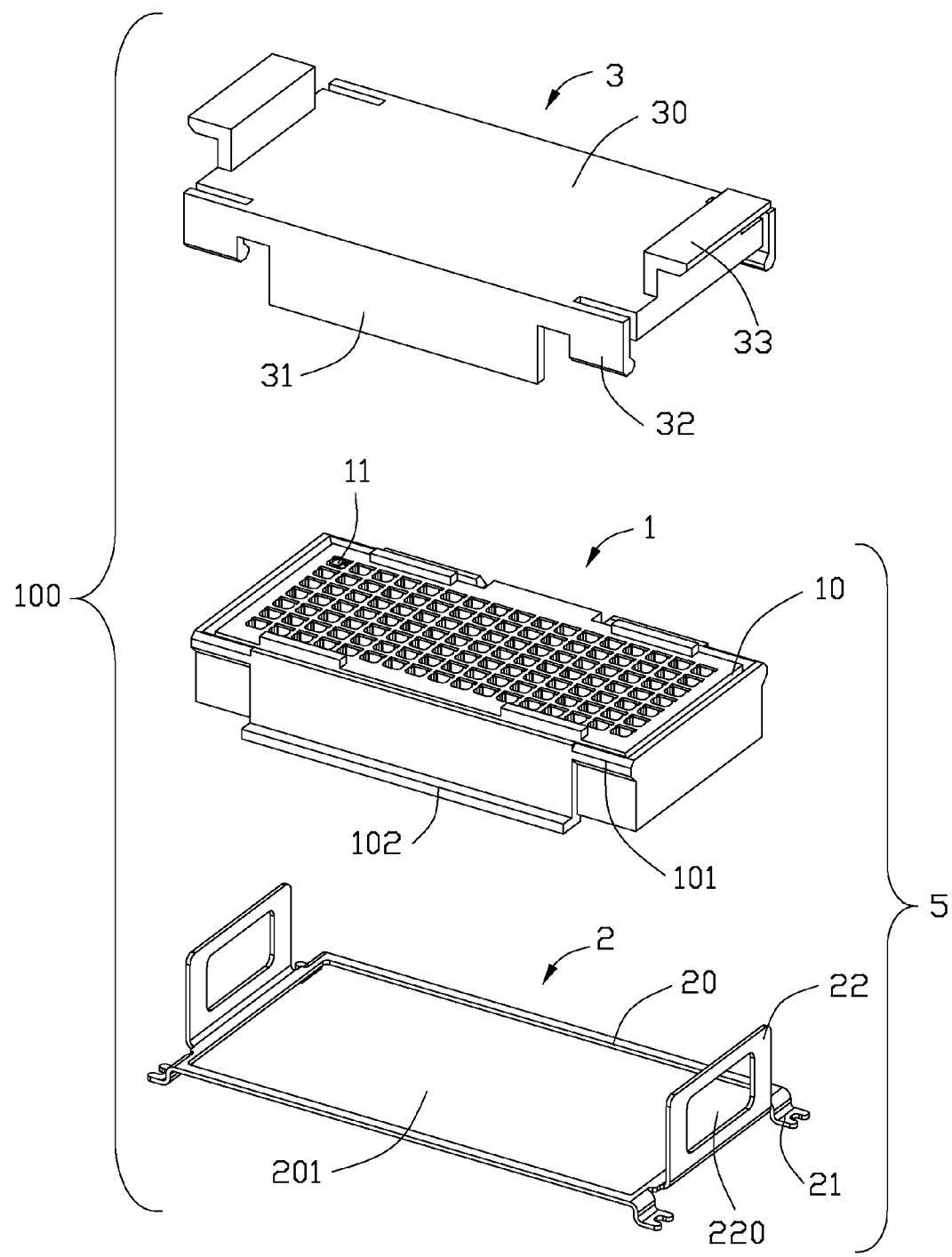
FIG. 1 is an exploded view of an electrical connector assembly according to a preferred embodiment of the present invention.
Figure 3:
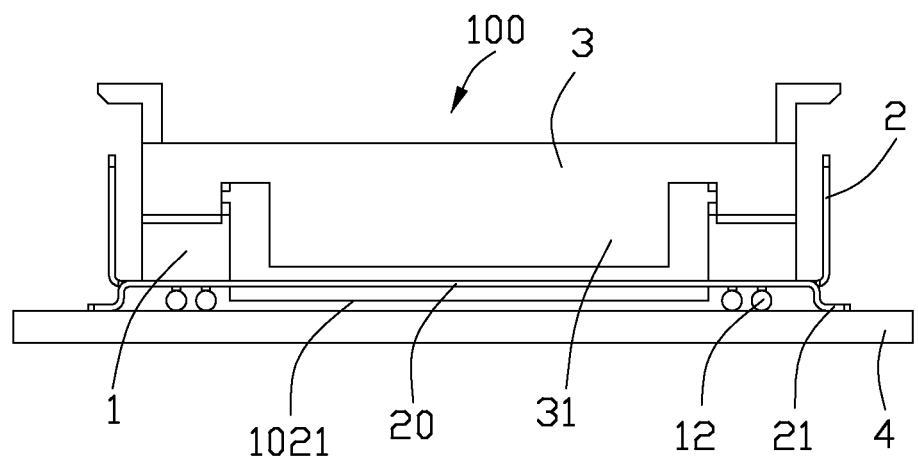
FIG. 3 is a side view of the electrical connector assembly as shown in FIG. 2, showing the electrical connector assembly not soldered to a substrate.

FIGS. 1 and 3 illustrates an electrical connector assembly 100 in accordance to a preferred embodiment of the present invention, the electrical connector assembly 100. The electrical connector assembly 100 comprises an electrical connector 5 soldered to a substrate 4 and a pick up cap 3 assembled to the electrical connector 5. The electrical connector 5 and comprises an insulative housing 1 with a plurality of electrical contacts 11, a plurality of soldering members 12 connected with the contacts 11 and a position member 2 surrounded the insulative housing 1 and moved upwardly and downwardly relative to the insulative housing 1. The soldering members 12 protrude beyond the bottom of the insulative housing 1.

The insulative housing 1 comprises a main portion 10, a pair of fasten portions 101 and a limit portion 102 protruded outwardly from the main portion 10. The limit portion 102 defines a bottom surface 1021 near the substrate 4. The soldering members 12 protrude beyond the bottom surface 1021 of the limit portion 102.

The position member 2 comprises a body portion 20, four soldering portions 21 extending downwardly from the body portion 20 and a pair of retention portions 22 extending upwardly from the body portion 20. The body portion 20 defines a window 201 for receiving the insulative housing 1. Each of the retention portions 22 defines a hole 220.

The pick up cap 3 comprises a plate suck portion 30, a stop portion 31 and a fix portion 32 extending downwardly from the suck portion 30, and a hand portion 33 extending upwardly from the suck portion 30. The hand portion 33 is used to grab the pick up cap 3. The stop portion 31 protrudes toward the limit portion 102 of the insulative housing 1.

Figure 2:
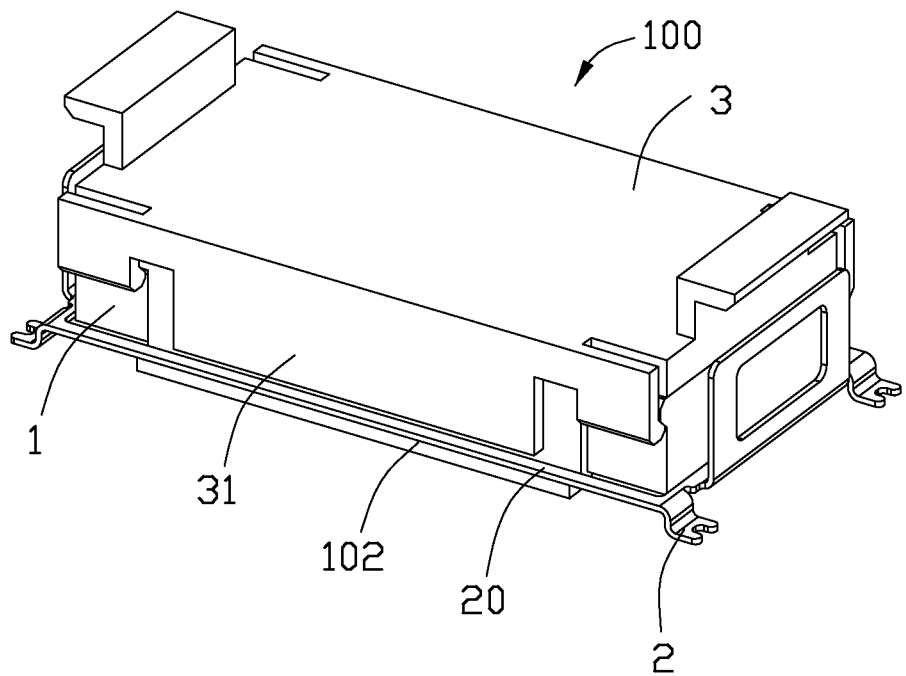
FIG. 2 is an assembled view of the electrical connector assembly as shown in FIG. 1.

Referring to FIG. 2, after the electrical connector assembly 100 is assembled, the position member 2 surrounds the insulative housing 1, the fix portion 32 of the pick up cap 3 interlocks with the fasten portion 101 of the insulative housing 1 to make the pick up cap 3 positioned on the insulative housing 1 securely, the body portion 20 of the position member 2 locates between the limit portion 102 of the insulative housing 1 and the stop portion 31 of the pick up cap 3, which to prevent the position member 2 break away from the insulative housing 1.

Referring to FIG. 3, when the electrical connector assembly 100 is put on the substrate 4, the four soldering portions 201 of the position member 2 and the soldering members 12 of the electrical connector 5 support on the substrate 4, the body portion 20 of the position member 2 locates between the limit portion 102 of the insulative housing 1 and the stop portion 31 of the pick up cap 3, there is a space between the body portion 20 of the position member 2 and the stop portion 31 of the pick up cap 3. When the electrical connector assembly 100 is soldered to the substrate 4, the four soldering members 201 of the position member 2 and the soldering members 12 of the electrical connector 5 are soldered to the substrate 4 during a same process.

Figure 4:
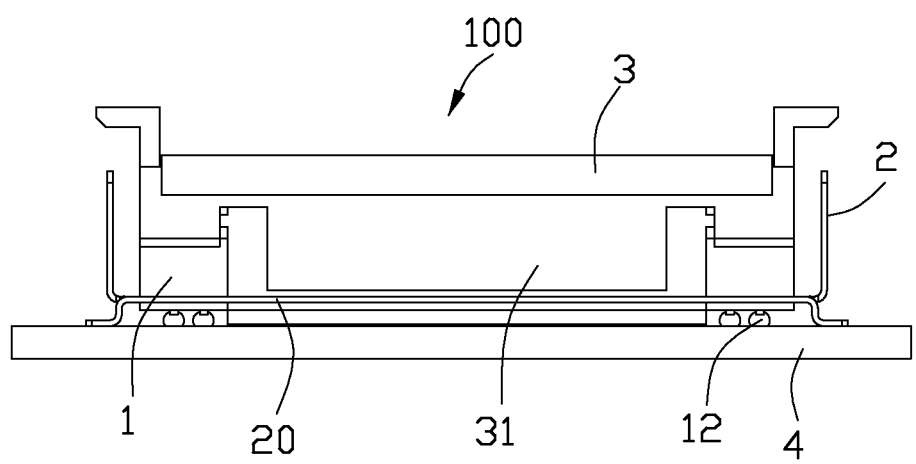
FIG. 4 is similar to FIG. 3, showing the electrical connector assembly soldered to the substrate.

Referring to FIG. 4, during the process of soldered the electrical connector assembly 100, the insulative housing 1 receives in the window 201 of the position member 2 and moves downwardly when the soldering members 12 are melted, thus to ensure the connection between the soldering members 12 and the substrate 4.

Figure 5:
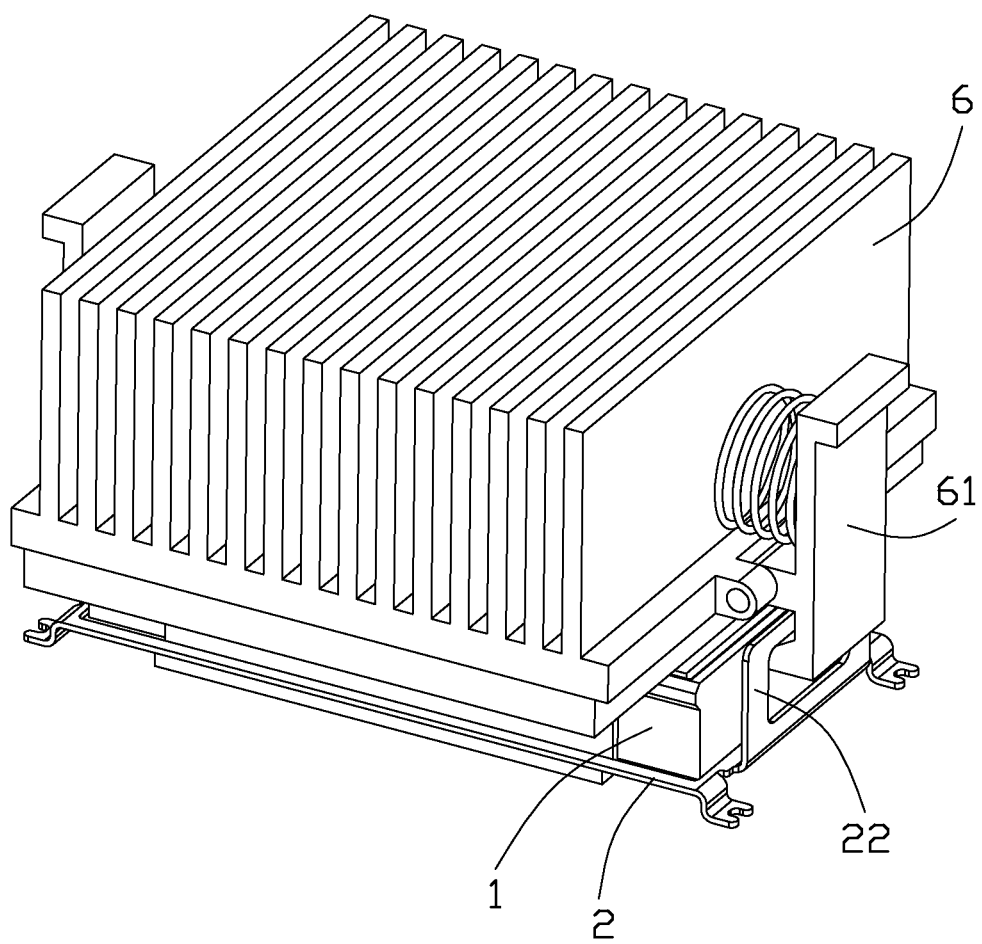
FIG. 5 is an assembled view of the electrical connector assembly and a heat sink.

Referring to FIG. 5, the position member 2 also can be used to position a heat sink 6 assembled to the electrical connector 5. The hook 61 of the heat sink 6 goes through the hole 220 of the retention portions 22 and interlocks with the retention portions 22 of the position member 2, thus the heat sink 6 is positioned on the electrical connector 5 securely.

While the preferred embodiments in accordance with the present invention has been shown and described, equivalent modifications and changes known to persons skilled in the art according to the spirit of the present invention are considered within the scope of the present invention as defined in the appended claims.

What is claimed is:

1. An electrical connector assembly for soldering to a substrate, comprising:
   an electrical connector for soldering to the substrate, the electrical connector comprising an insulative housing with a plurality of contacts received therein, a plurality of soldering members connected the contacts and a position member surrounded the insulative housing, the position member moved upwardly and downwardly relative to the insulative housing, the insulative housing comprising a limit portion protruded outwardly; and
   a pick up cap assembled to the electrical connector, the pick-up cap comprises a stop portion protruded toward the limited portion; wherein
   the position member comprises a body portion positioned between the stop portion and the limit portion, the soldering members protruded beyond the bottom of the insulative housing, when the soldering members and the position member are put on a same plane, there is a space between the body portion of the position member and the stop portion of the pick-up cap; wherein
   the position member further comprises a soldering portion extending downwardly from the body portion, the soldering portion and the electrical connector are soldered to the substrate respectively without being influenced by each other; wherein
   the position member further comprises a retention portion extending upwardly from the body portion, and the retention portion is used to position a heat sink assembled to the electrical connector.

2. The electrical connector assembly as claimed in claim 1, wherein the pick-up cap comprises a plate suck portion, the stop portion extends downwardly from the suck portion.

3. The electrical connector assembly as claimed in claim 2, wherein the pick-up cap further comprises a fix portion extending downwardly from the suck portion, the insulative housing comprises a fasten portion interlocked with the fix portion.

4. An electrical connector for mounting to a printed circuit board, comprising:
   an insulative housing defining an upward facing limiting portion;
   a plurality of conductive contacts disposed in the housing;
   a plurality of solder balls attached to bottom ends of the contacts, respectively, and exposed under a bottom face of the housing;
   a pick-up cap detachably mounted upon a top face of the housing and defining a downward facing stop portion; and
   a metallic position member floatable relative to the housing in a vertical direction within a range restricted by said limiting portion and said stop portion before the connector is mounted to the printed circuit board; wherein
   the position member is upwardly spaced, in the vertical direction, from the limit portion after both the solder balls and a solder portion of said position member are physically and independently soldered upon the printed circuit board without being influenced by each other; wherein
   before the connector is mounted to the printed circuit board, a bottom face of the solder pad is roughly coplanar with bottom apexes of said solder balls and a corresponding portion of the position member is seated upon the limit portion; wherein
   in operation, said pick-up cap is removed from the housing for allowing an electronic package to be received in the housing.

5. The electrical connector as claimed in claim 4, wherein the limit portion and the stop portion are essentially opposite to each other in the vertical direction.

6. The electrical connector as claimed in claim 5, further including means for fastening the pick-up cap unto the housing, wherein said means is not aligned with either the stop portion or the limit portion in the vertical direction but being offset therefrom in a transverse direction perpendicular to said vertical direction.

7. The electrical connector as claimed in claim 4, wherein during using, said electronic package is seated upon the top face of the housing and a heat sink is mounted upon the electronic package, and said position member further includes a locking hole into which a pivotal hook of said heat sink is locked.

8. The electrical connector as claimed in claim 4, wherein said position member defines a frame structure surrounding the housing, and is equipped with a plurality of solder portions for mounting to the printed circuit board.

9. An electrical connector for mounting to a printed circuit board, comprising:
   an insulative housing defining an upward facing limiting portion;
   a plurality of conductive contacts disposed in the housing;
   a plurality of solder balls attached to bottom ends of the contacts, respectively, and exposed under a bottom face of the housing;
   a pick-up cap detachably mounted upon a top face of the housing and defining a downward facing stop portion; and
   a metallic position member floatable relative to the housing in a vertical direction within a range restricted by said limiting portion and said stop portion before the connector is mounted to the printed circuit board; wherein
   the limit portion and the stop portion are essentially opposite to each other in the vertical direction;
   further including means for fastening the pick-up cap unto the housing, wherein said means is not aligned with either the stop portion or the limit portion in the vertical direction but being offset therefrom in a transverse direction perpendicular to said vertical direction; wherein
   in operation, said pick-up cap is removed from the housing for allowing an electronic package to be received in the housing.

10. The electrical connector as claimed in claim 9, wherein during using, said electronic package is seated upon the top face of the housing and a heat sink is mounted upon the electronic package, and said position member further includes a locking hole into which a pivotal hook of said heat sink is locked.

11. The electrical connector as claimed in claim 9, wherein said position member defines a frame structure surrounding the housing, and is equipped with a plurality of solder portions for mounting to the printed circuit board.

* * * * *